(12) United States Patent
Chen et al.

(10) Patent No.: US 8,716,133 B2
(45) Date of Patent: May 6, 2014

(54) THREE PHOTOMASK SIDEWALL IMAGE TRANSFER METHOD

(75) Inventors: Shyng-Tsong Chen, Patterson, NY (US); Ryan O. Jung, Rensselaer, NY (US); Neal V. Lafferty, Albany, NY (US); Yunpeng Yin, Niskayuna, NY (US)

(73) Assignee: International Business Machines Corporation, Armonk, NY (US)

(*) Notice: Subject to any disclaimer, the term of this patent is extended or adjusted under 35 U.S.C. 154(b) by 62 days.

(21) Appl. No.: 13/592,683

(22) Filed: Aug. 23, 2012

(65) Prior Publication Data

US 2014/0057436 A1 Feb. 27, 2014

(51) Int. Cl.
*H01L 21/44* (2006.01)
(52) U.S. Cl.
USPC ............ 438/675; 257/E21.249; 257/E21.257; 257/E21.305; 257/E21.582; 257/E21.595; 438/618; 438/672; 438/696; 438/703; 438/717; 438/942
(58) Field of Classification Search
USPC .................. 257/E21.249, E21.257, E21.305, 257/E21.582, E21.595; 438/618, 672, 675, 438/696, 703, 717, 942
See application file for complete search history.

(56) References Cited

U.S. PATENT DOCUMENTS

| | | | |
|---|---|---|---|
| 6,951,784 B1 | 10/2005 | Anderson et al. | |
| 7,346,887 B2 | 3/2008 | Liebmann et al. | |
| 2007/0249170 A1* | 10/2007 | Kewley | 438/706 |
| 2008/0006852 A1 | 1/2008 | Beintner et al. | |
| 2008/0206996 A1 | 8/2008 | Furukawa et al. | |
| 2010/0029081 A1 | 2/2010 | Wells et al. | |
| 2010/0093175 A1* | 4/2010 | Niroomand et al. | 438/694 |
| 2010/0291771 A1* | 11/2010 | Zhou et al. | 438/710 |
| 2010/0308015 A1* | 12/2010 | Takano et al. | 216/37 |
| 2011/0111596 A1 | 5/2011 | Kanakasabapathy | |
| 2011/0113393 A1 | 5/2011 | Sezginer | |
| 2011/0291224 A1 | 12/2011 | Fischer et al. | |
| 2011/0300711 A1* | 12/2011 | Martin et al. | 438/696 |
| 2012/0058640 A1* | 3/2012 | Kim et al. | 438/675 |
| 2012/0132616 A1* | 5/2012 | Barnola et al. | 216/41 |
| 2012/0244711 A1* | 9/2012 | Yin et al. | 438/703 |
| 2012/0282778 A1* | 11/2012 | Light et al. | 438/703 |
| 2012/0282779 A1* | 11/2012 | Arnold et al. | 438/703 |

(Continued)

OTHER PUBLICATIONS

Yu et al., Layout Decomposition for Triple Patterning Lithography, 978-1-4577-1400-0/11 copyright 2011 IEEE, pp. 1-8.

*Primary Examiner* — Asok K Sarkar
(74) *Attorney, Agent, or Firm* — Schmeiser, Olsen & Watts; Parashos Kalaitzis

(57) ABSTRACT

A three photomask image transfer method. The method includes using a first photomask, defining a set of mandrels on a hardmask layer on a substrate; forming sidewall spacers on sidewalls of the mandrels, the sidewall spacers spaced apart; removing the set of mandrels; using a second photomask, removing regions of the sidewall spacers forming trimmed sidewall spacers and defining a pattern of first features; forming a pattern transfer layer on the trimmed sidewall spacers and the hardmask layer not covered by the trimmed sidewall spacers; using a third photomask, defining a pattern of second features in the transfer layer, at least one of the second features abutting at least one feature of the pattern of first features; and simultaneously transferring the pattern of first features and the pattern of second features into the hardmask layer thereby forming a patterned hardmask layer.

20 Claims, 16 Drawing Sheets

(56) References Cited

U.S. PATENT DOCUMENTS

| | | | |
|---|---|---|---|
| 2013/0059438 A1* | 3/2013 | Zhou et al. | 438/689 |
| 2013/0084655 A1* | 4/2013 | Yue et al. | 438/7 |
| 2013/0084688 A1* | 4/2013 | O'Meara et al. | 438/478 |
| 2013/0089984 A1* | 4/2013 | Raghunathan et al. | 438/696 |
| 2013/0105948 A1* | 5/2013 | Kewley | 257/618 |
| 2013/0115778 A1* | 5/2013 | Xue et al. | 438/703 |
| 2013/0230988 A1* | 9/2013 | Shini | 438/703 |
| 2013/0244437 A1* | 9/2013 | Flachowsky et al. | 438/703 |

* cited by examiner

THREE PHOTOMASK SIDEWALL IMAGE TRANSFER METHOD

FIELD OF THE INVENTION

The present invention relates to the field of integrated circuits; more specifically, it relates to a method for forming integrated circuit structures and particularly damascene wire structures.

BACKGROUND

As integrated circuit feature size has decreased a method of sidewall image transfer (SIT) patterning has been employed for advanced integrated circuit manufacture. However, when used to fabricate the electrical interconnects of the wiring levels, wires formed at one wiring level using SIT cannot be connected to wires formed by non-SIT patterning on the same level and another wiring level must be used to do so. This adds integrated circuit design restrictions which complicates, or in some cases excludes, certain circuit features from the integrated circuit design. Accordingly, there exists a need in the art to eliminate the deficiencies and limitations described hereinabove.

SUMMARY

A first aspect of the present invention is a method, comprising: using a first photomask, defining a set of mandrels on a hardmask layer on a substrate; forming sidewall spacers on sidewalls of the mandrels, the sidewall spacers spaced apart; removing the set of mandrels; using a second photomask, removing regions of the sidewall spacers forming trimmed sidewall spacers and defining a pattern of first features; forming a pattern transfer layer on the trimmed sidewall spacers and the hardmask layer not covered by the trimmed sidewall spacers; using a third photomask, defining a pattern of second features in the transfer layer, at least one of the second features abutting at least one feature of the pattern of first features; and simultaneously transferring the pattern of first features and the pattern of second features into the hardmask layer thereby forming a patterned hardmask layer.

A second aspect of the present invention is a method comprising: using a first photomask, defining a set of mandrels on a hardmask layer on a substrate; forming sidewall spacer loops on sidewalls of the mandrels; removing the set of mandrels; using a second photomask, trimming the sidewall spacer loops to form trimmed sidewall spacers; forming a pattern transfer layer on the trimmed sidewall spacers and the hardmask layer not covered by the trimmed sidewall spacers; using a third photomask, defining a pattern of second features in the transfer layer, at least one of the second features abutting at least one feature of the pattern of first features; and simultaneously transferring the pattern of first features and the pattern of second features into the hardmask layer thereby forming a patterned hardmask layer.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION

The embodiments of the present invention describe a three photomask process wherein all three masks are used on the same fabrication level (e.g., a wiring level of an integrated circuit which comprises damascene wires embedded in an interlevel dielectric (ILD) layer). The first photomask is used to define structures defined by mandrels and the spaces between mandrels before mandrel removal. The second photomask is used to trim the sidewall spacers after mandrel removal. The third photomask is used to interconnect the features defined by the first photomask. SIT patterning is defined as using sidewall spacers formed on the sidewalls of a mandrel to define the shape of a feature (e.g., an insulator between damascene wire). Non-SIT patterning is defined as using a structure (e.g., the mandrel itself) or spaces between sidewall spacers before mandrel removal to define the shape of a feature (e.g., a damascene wire). Thus, mandrel defined features and features defined by the space between sidewall spacers before mandrel removal are non-SIT features. The term "shape" refers to the outline of the feature in top view. Thus, some the shape of features will be defined by the sidewall spacers on the sidewalls of mandrels and some features will be defined by the mandrels themselves.

Figure 1A:
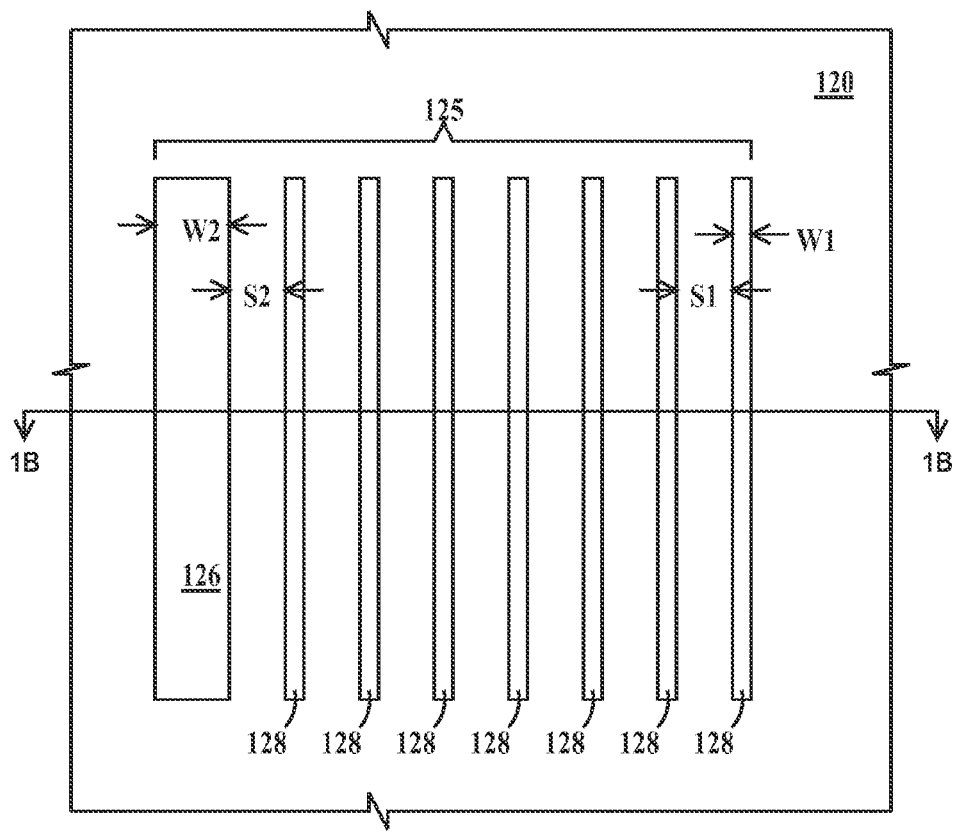
FIGS. 1 through 13 illustrate a method of forming a transfer pattern having SIT and non-SIT features interconnected according to embodiments of the present invention.
Figure 1B:
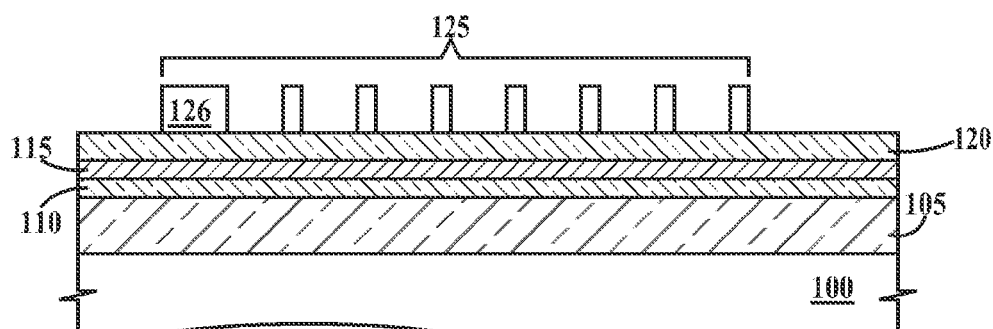

FIGS. 1 through 13 illustrate a method of forming a transfer pattern having SIT and non-SIT features interconnected according to embodiments of the present invention. FIG. 1A is a top view and FIG. 1B is a cross-section view through line 1B-1B of FIG. 1A. In FIGS. 1A and 1B, formed on a semiconductor substrate 100 (which may be a bulk silicon substrate or a silicon on insulator (SOI) substrate and contain field effect transistors) is a dielectric layer 105. Formed on a top surface of dielectric layer 105 is a first hardmask layer 110 and formed on a top surface of first hardmask layer 110 is a second hardmask layer 115. Formed on a top surface of second hardmask layer 115 is a mandrel layer 120. Formed on a top surface of mandrel layer 120 are a first patterned photomask layer 125 which includes a wide photoresist line 126 and a plurality of narrow photoresist lines 128 all having their respective longitudinal axes parallel. Narrow photoresist lines 128 are W1 wide and spaced apart a distance S1. Wide photoresist line 126 is W2 wide and spaced a distance S2 from the adjacent narrow photoresist line 128.

In one example, S1 is between about 54 nm and about 90 nm. In one example, S2 is between about 54 nm and about 300 nm. In one example, S1=S2. In one example, W1 is between about 18 nm and about 60 nm. In one example, W2 is between about 54 nm and about 300 nm.

In one example, dielectric layer 105 is a low K (dielectric constant) material, examples of which include but are not limited to hydrogen silsesquioxane polymer (HSQ), methyl silsesquioxane polymer (MSQ), SiLK™ (polyphenylene oligomer) manufactured by Dow Chemical, Midland, Tex., Black Diamond™ (methyl doped silica or $SiO_x(CH_3)_y$ or $SiC_xO_yH_y$ or SiOCH) manufactured by Applied Materials, Santa Clara, Calif., organosilicate glass (SiCOH), and porous SiCOH. In one example, dielectric layer 105 is between about 300 nm and about 2,000 nm thick. A low K dielectric material has a relative permittivity of about 2.4 or less. In one example, dielectric layer 105 comprises materials independently selected from the group consisting of porous or nonporous silicon dioxide ($SiO_2$), fluorinated $SiO_2$ (FSG). In one example, first hardmask 110 comprises tetraethylorthosilicate (TEOS). In one example, second hardmask layer 115 comprises titanium nitride (TiN).

Patterned photoresist layer 125 is formed by a photolithographic process. A photolithographic process is one in which a photoresist layer is applied to a surface of a substrate, the photoresist layer exposed to actinic radiation through a patterned photomask and the exposed photoresist layer developed to form a patterned photoresist layer. When the photoresist layer comprises positive photoresist, the developer dissolves the regions of the photoresist exposed to the actinic radiation and does not dissolve the regions where the patterned photomask blocked (or greatly attenuated the intensity of the radiation) from impinging on the photoresist layer. When the photoresist layer comprises negative photoresist, the developer does not dissolve the regions of the photoresist exposed to the actinic radiation and does dissolve the regions where the patterned photomask blocked (or greatly attenuated the intensity of the radiation) from impinging on the photoresist layer.

Figure 2A:
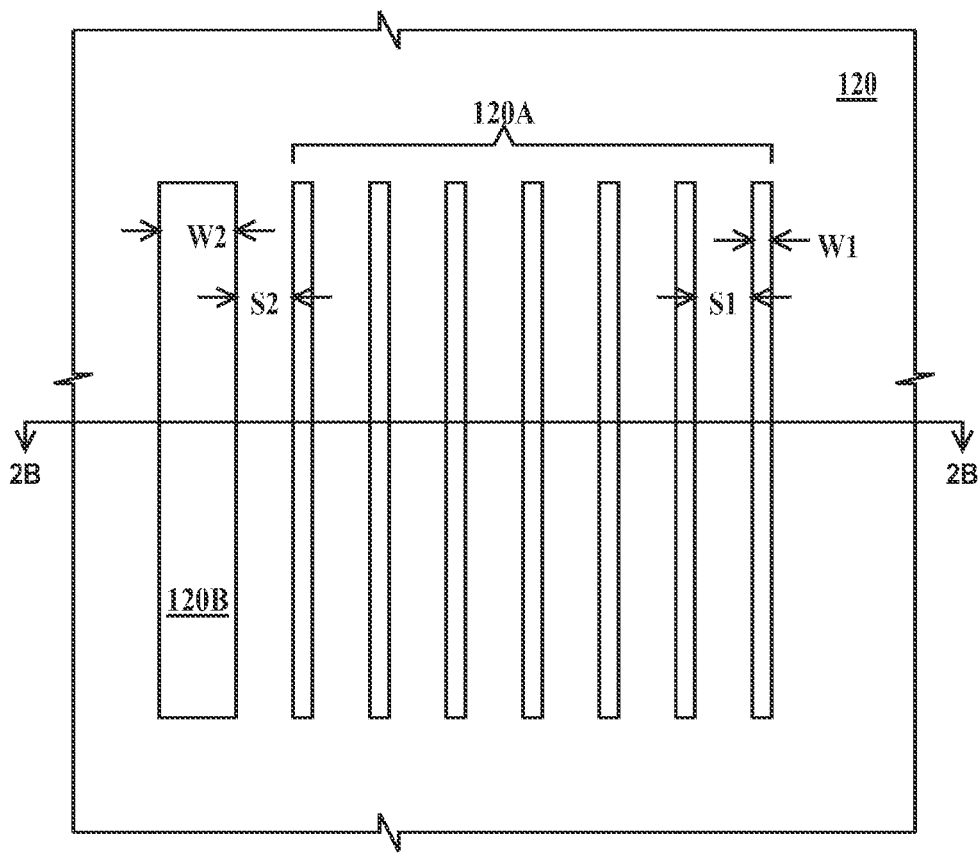
Figure 2B:
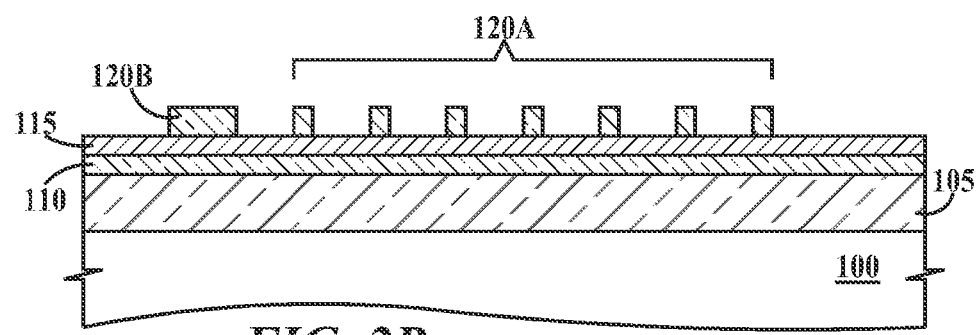

FIG. 2A is a top view and FIG. 2B is a cross-section view through line 2B-2B of FIG. 2A. In FIGS. 2A and 2B, hardmask layer 120 (see FIG. 1B) has been etched and patterned photoresist layer 125 removed (see FIG. 1B) to form an array of narrow mandrels 120A and a wide mandrel 120B. Narrow mandrels 120A are about W1 wide and spaced apart about distance S1. Wide mandrel 120B is about W2 wide and spaced about distance S2 from the adjacent narrow mandrel 120A.

Figure 3A:
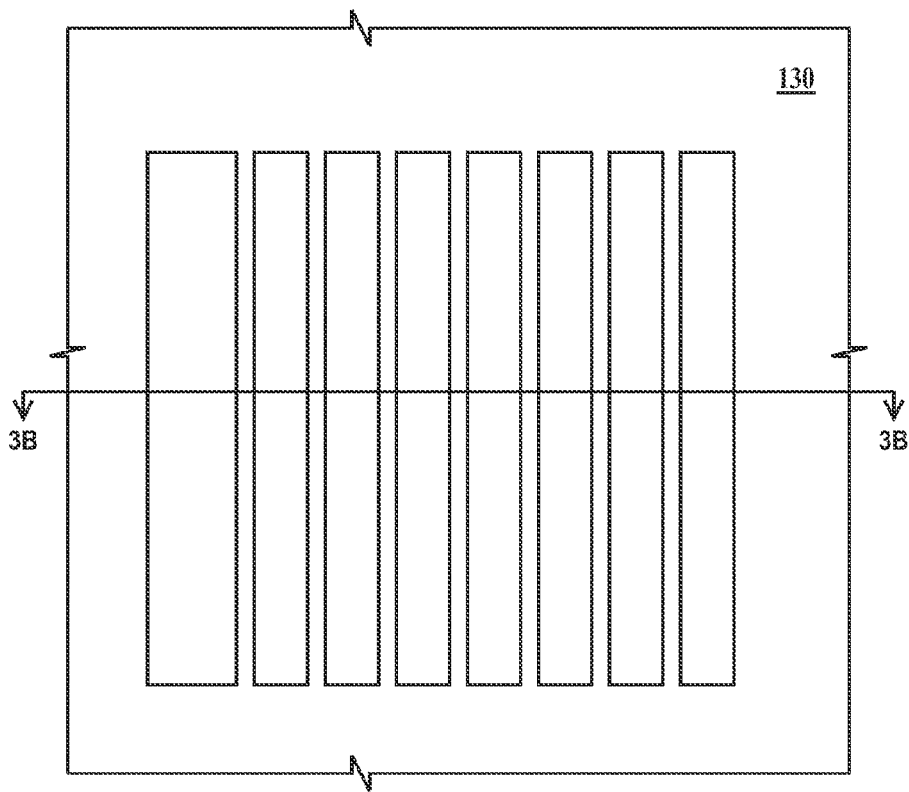
Figure 3B:
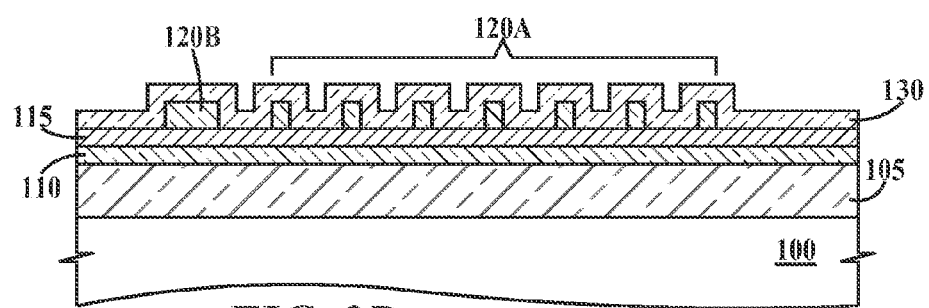

FIG. 3A is a top view and FIG. 3B is a cross-section view through line 3B-3B of FIG. 3A. In FIGS. 3A and 3B, a conformal layer 130 is formed on the top surfaces and sidewalls of mandrels 120A and 120B and the regions of the top surface of second hardmask 115 between the mandrels. In one example, conformal layer 130 comprises silicon nitride. In one example, conformal layer 130 is between about 18 nm and about 60 nm thick.

Figure 4A:
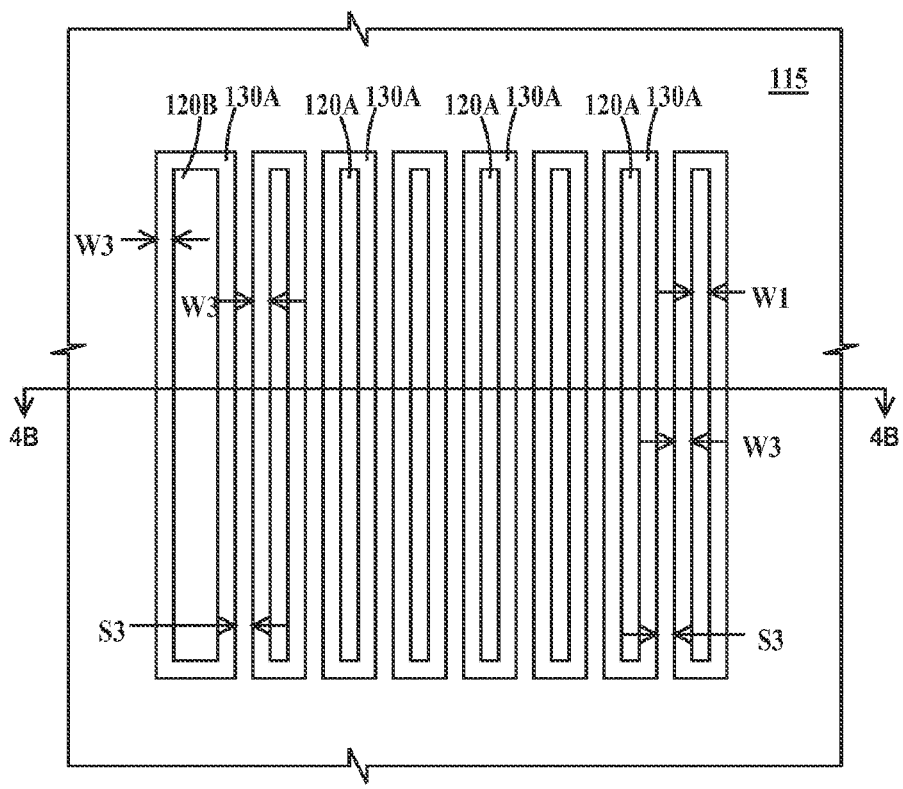
Figure 4B:
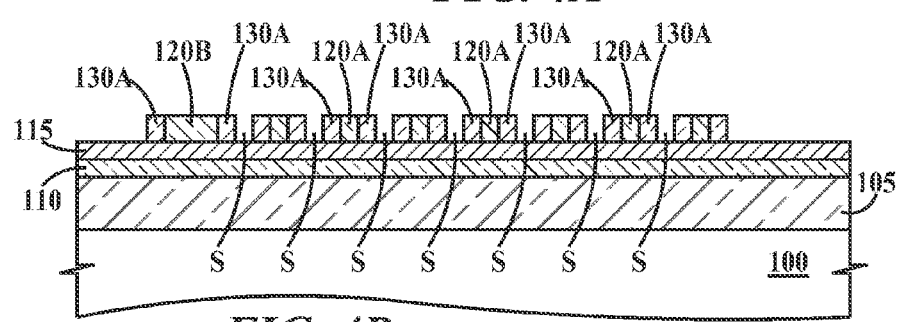

FIG. 4A is a top view and FIG. 4B is a cross-section view through line 4B-4B of FIG. 4A. In FIGS. 4A and 4B, an anisotropic etch such as a directional reactive ion etch (RIE) that is selective to the material of conformal layer 130 (see FIG. 3B) is performed to form loops of sidewall spacers 130A on the sidewalls of mandrels 120A and 120B. Note the spaces "S" between opposite facing sidewall spacers 120A on adjacent mandrels 120A. The width W3 of sidewall spacers 130A is about the same as the thickness of conformal layer 130 (see FIG. 3B). Sidewall spacers 130A on adjacent mandrels are spaced a distance S3 apart. In one example, S3=W1=W3. In one example, S3 is between about 18 nm and about 60 nm.

Figure 5A:
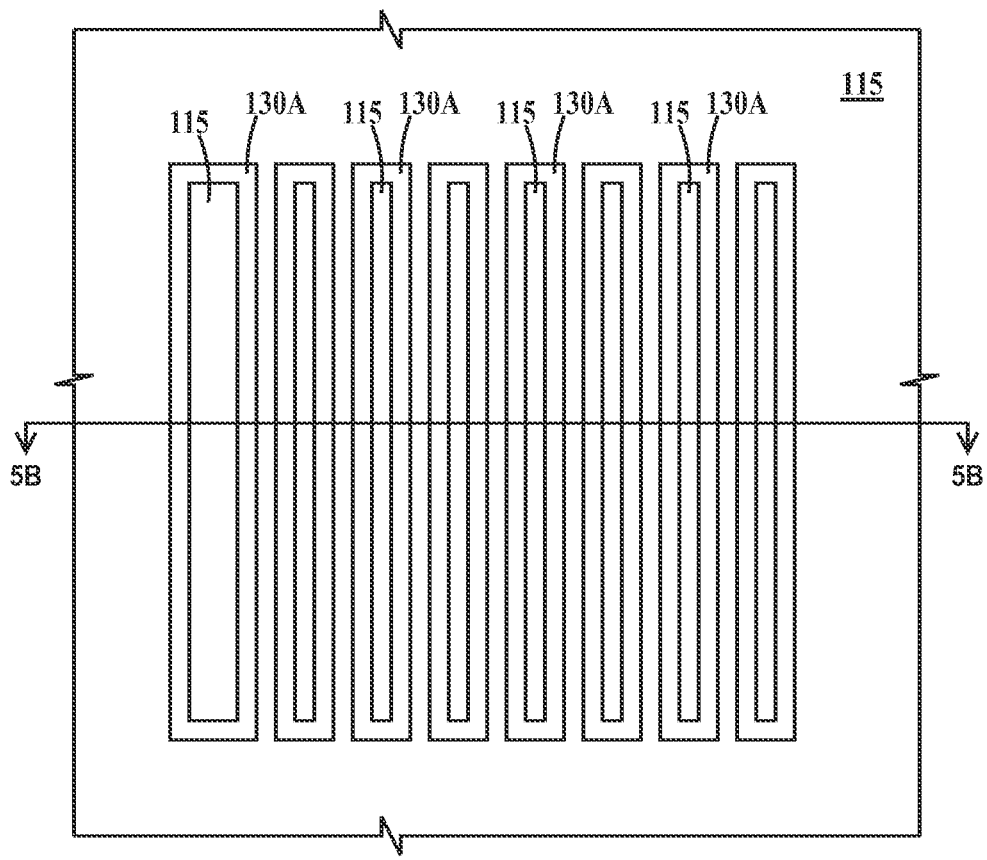
Figure 5B:
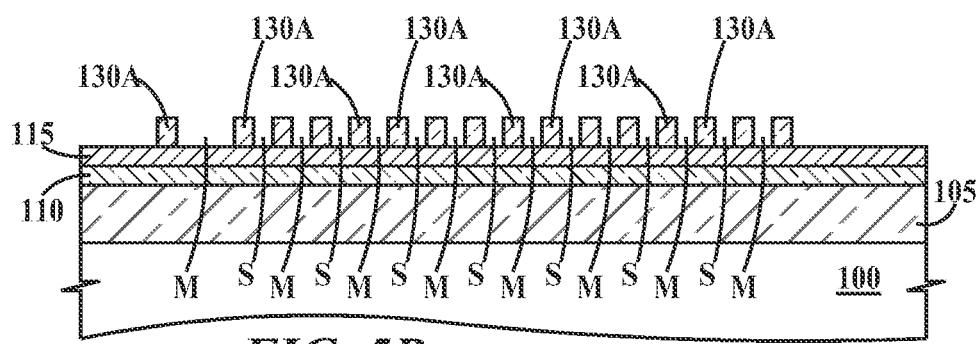

FIG. 5A is a top view and FIG. 5B is a cross-section view through line 5B-5B of FIG. 5A. In FIGS. 5A and 5B, mandrels 120A and 120B (see FIG. 4B) are removed. Note the spaces between adjacent sidewall spaces 130A marked "M" were where the mandrels were before mandrel removal. The spaces marked "S" were discussed supra with respect to FIG. 4B. Features that will be subsequently fabricated in dielectric layer 105 by transferring the pattern of "S" spaces are non-mandrel defined features. Features that will be subsequently transferred into dielectric layer using portions of the pattern of spaces "M" mandrel defined features. The pattern of sidewall spacers after trimming in FIGS. 9A, 9B and 9c) will be SIT features. Thus, both mandrel and non-mandrel features will have been defined by the first photomask of the three photomask process. Note the "S" and "M" spaces alternate. At this point, sidewall spacers 130A are loops with a void in the middle of the loop.

Figure 6A:
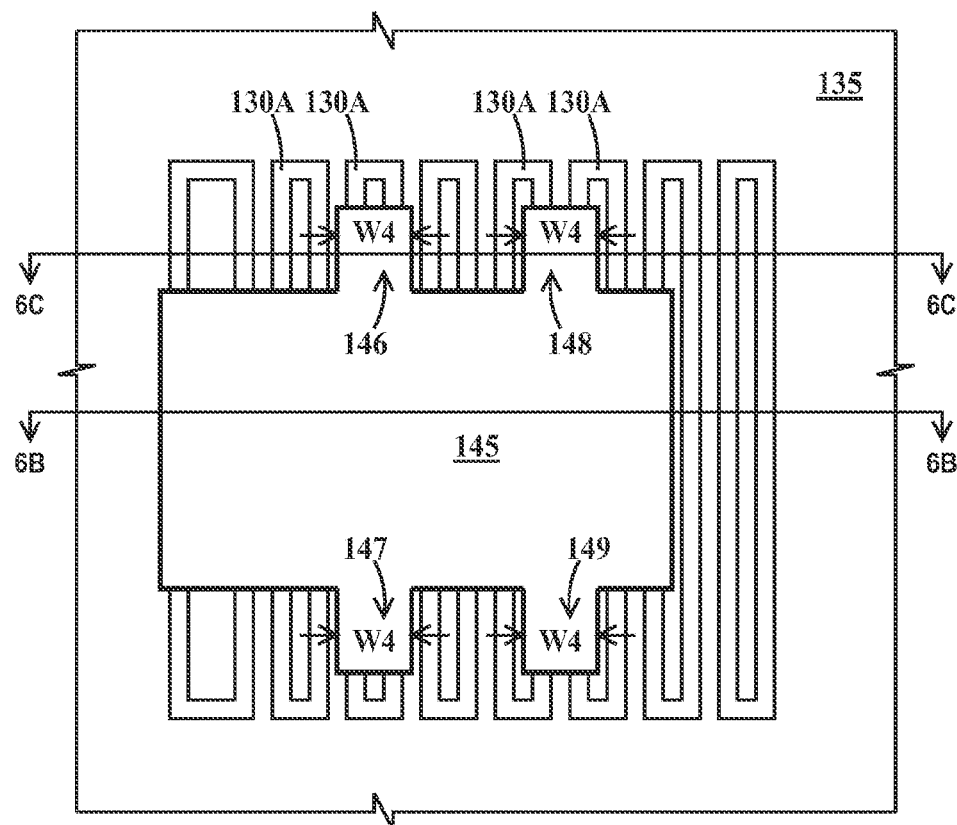
Figure 6B:
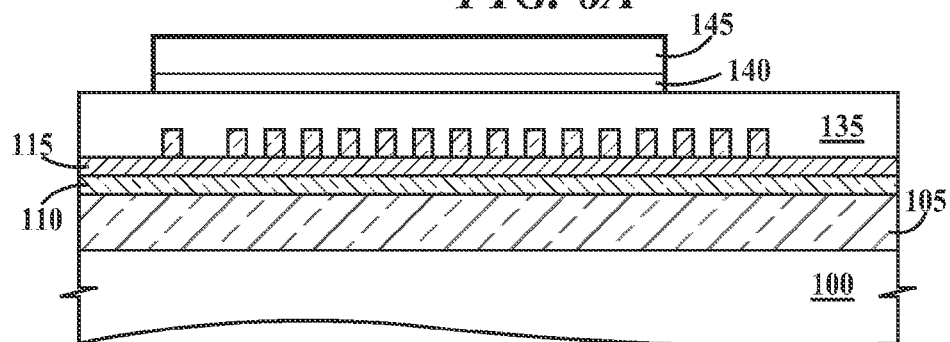
Figure 6C:
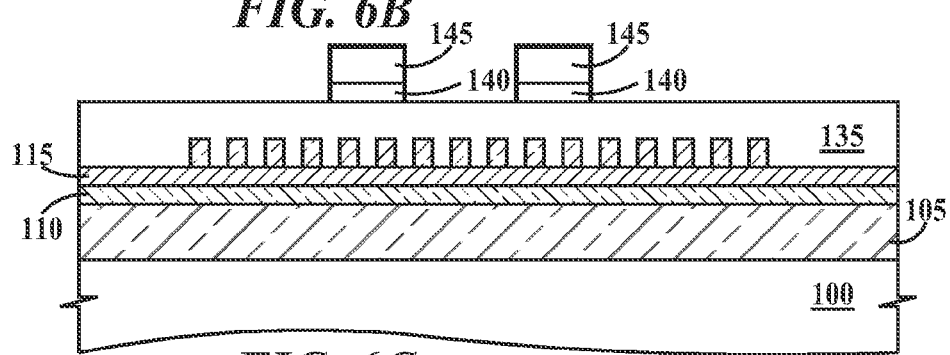

FIG. 6A is a top view, FIG. 6B is a cross-section view through line 6B-6B of FIG. 6A and FIG. 6C is a cross-section view through line 6C-6C of FIG. 6A. In FIGS. 6A, 6B and 6C, an organic planarization layer (OPL) 135 is formed on top surfaces and sidewalls of sidewall spacers 130A on the top surface of second hardmask layer 115 between the sidewall spacers. In one example, OPL 135 is an organic polymer that is not soluble in the developer used to develop the photoresist layer. An OPL forms a planar surface over an otherwise non-planar surface. An antireflective coating (ARC) 140 is formed on the top surface of OPL 135 and a second patterned photoresist layer 145 is formed on the top surface of ARC 140. Patterned photoresist layer 145 is used to "trim" the loops of sidewall spacers 130A into strips. ARC 140 was patterned during development of the photoresist. In one example, ARC 140 is a silicon containing ARC (SiARC). Referring to FIG. 6A, there are four regions 146, 147, 148 and 149 of patterned photoresist layer 145 that extend further over a portion of sidewall spacers 130A than other regions of patterned photoresist layer 145. Regions 146, 147, 148 and 149 have a width W4. Regions 146 and 147 extend over opposite sides of a loop of one sidewall spacer 130A. Regions 148 and 149 extend over adjacent sidewall spacer of two different sidewall spacer loops. W4 should be greater than W1+2×W3 for regions 146 and 147 and greater than S3+2×W3 for regions 148 and 149.

Figure 7A:
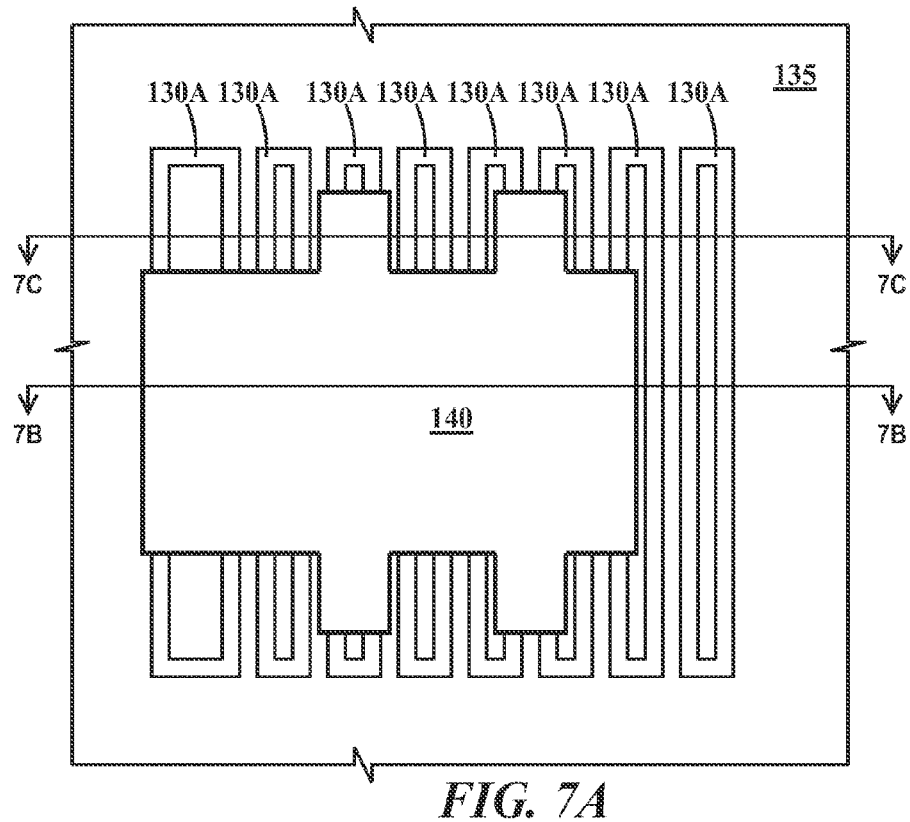
Figure 7B:
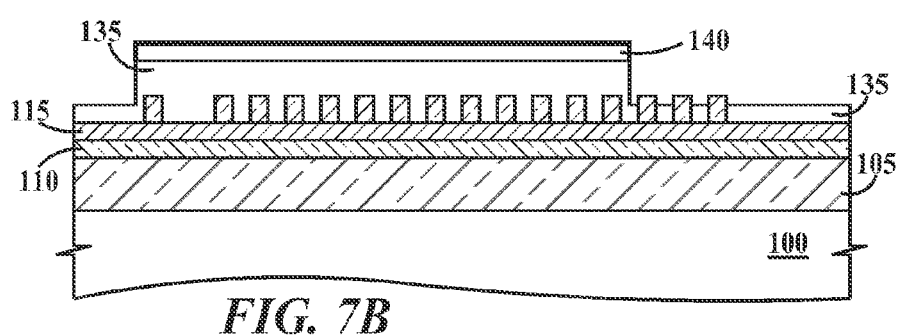
Figure 7C:
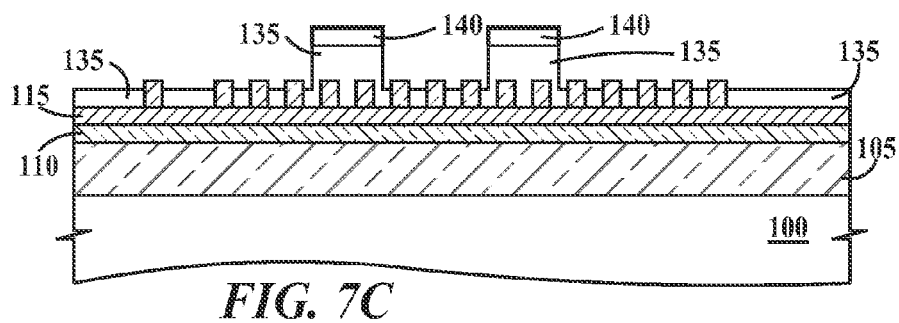

FIG. 7A is a top view, FIG. 7B is a cross-section view through line 7B-7B of FIG. 7A and FIG. 7C is a cross-section view through line 7C-7C of FIG. 7A. In FIGS. 7A, 7B and 7C, OPL 135 is partially removed (e.g., by RIE) where not protected by patterned photoresist layer 145 (see FIG. 6A) to expose those sidewall spacers 130A that were not under patterned photoresist layer 145. No region of OPL is completely removed at this point. However, the entire second patterned photoresist layer is removed during the OPL partial removal process so ARC 140 is exposed.

Figure 8A:
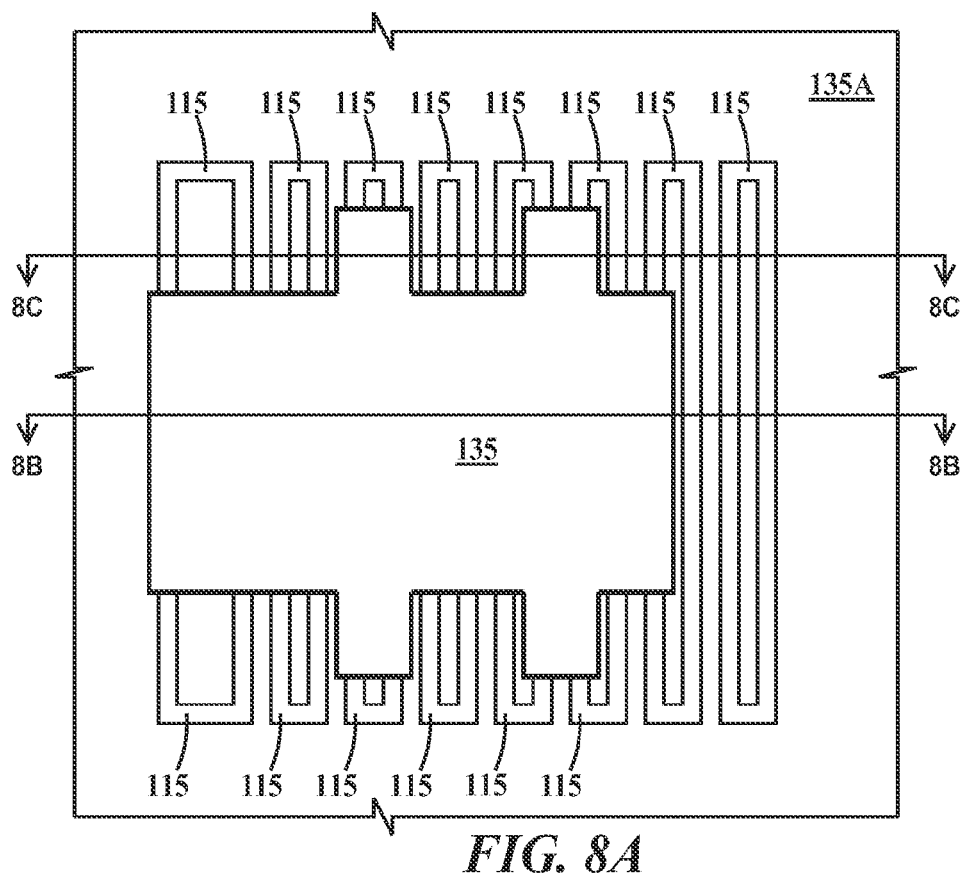
Figure 8B:
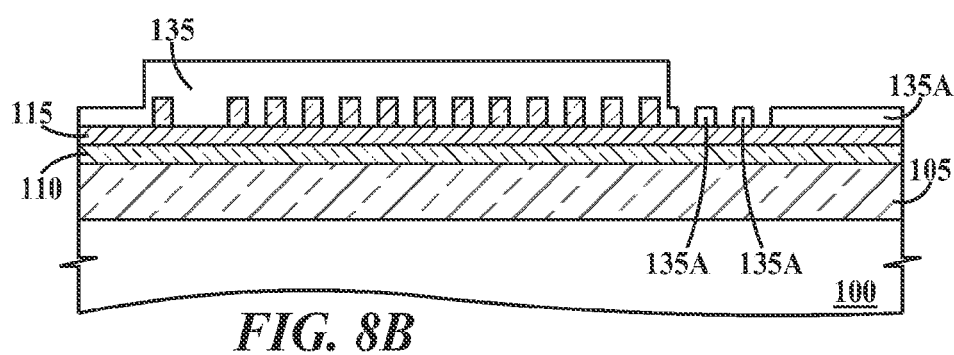
Figure 8C:
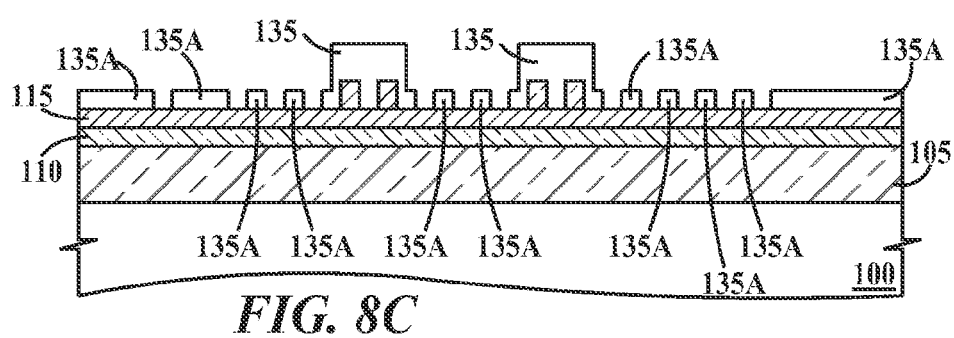

FIG. 8A is a top view, FIG. 8B is a cross-section view through line 8B-8B of FIG. 8A and FIG. 8C is a cross-section view through line 8C-8C of FIG. 8A. In FIGS. 8a, 8B and 8C, those regions of sidewall spacers 130A not protected by OPL layer 135 are removed leaving OPL islands 135A in those regions. ARC 140 (see FIG. 7A) is also removed.

Figure 9A:
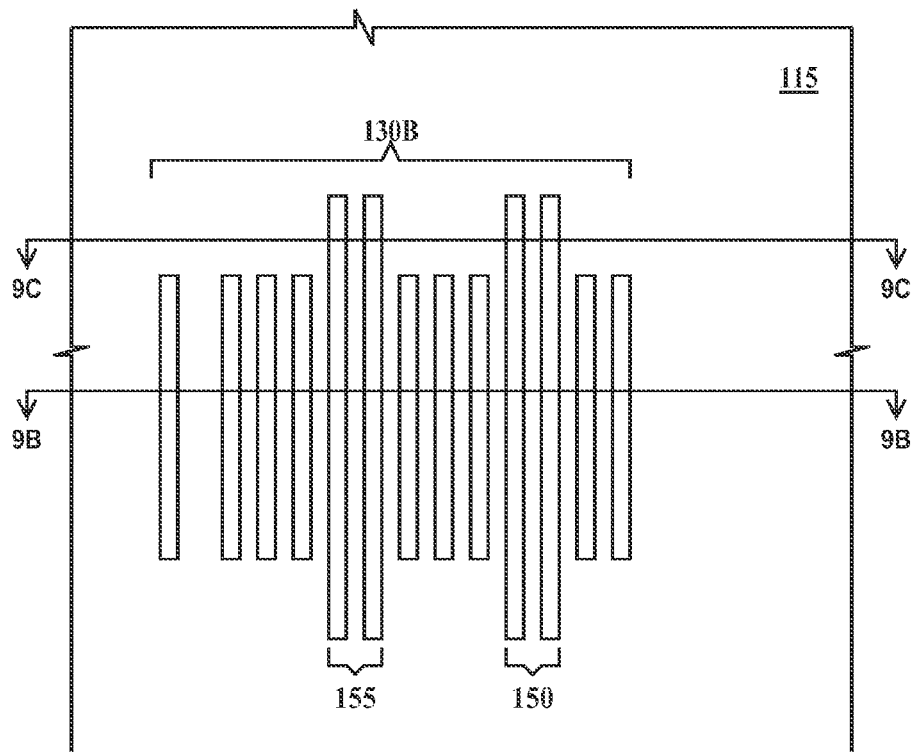
Figure 9B:
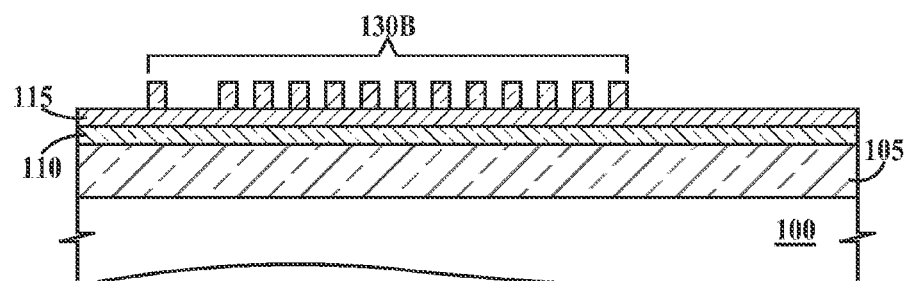
Figure 9C:
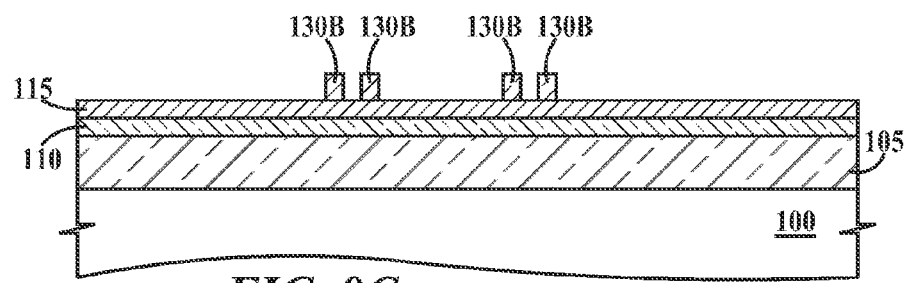

FIG. 9A is a top view, FIG. 9B is a cross-section view through line 9B-9B of FIG. 9A and FIG. 9C is a cross-section view through line 9C-9C of FIG. 9A. In FIGS. 9A, 9B and 9C, the remaining OPL 135 and 135A (see FIG. 8A) is removed to leave trimmed sidewall spacers 130B. Not a first pair 150 and a second pair 155 of sidewall spacers 130B extend past the other sidewall spacers 130B.

Figure 10A:
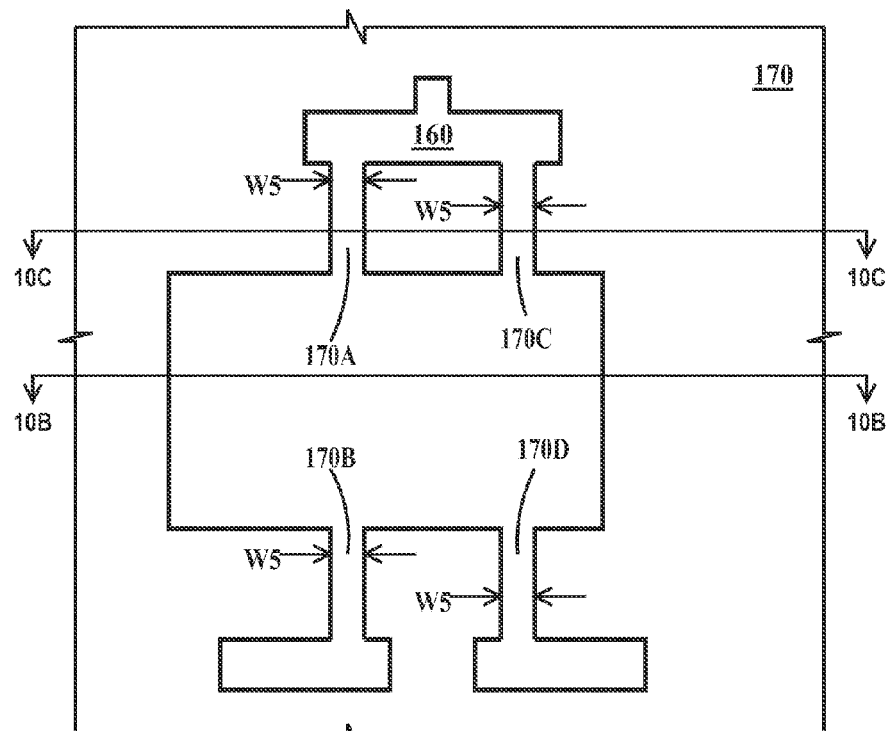
Figure 10B:
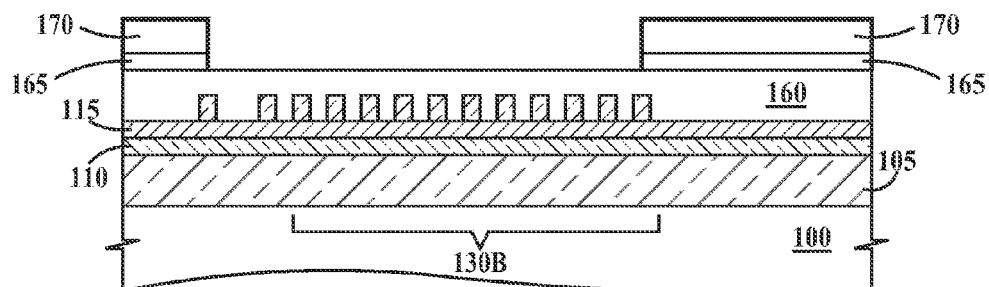
Figure 10C:
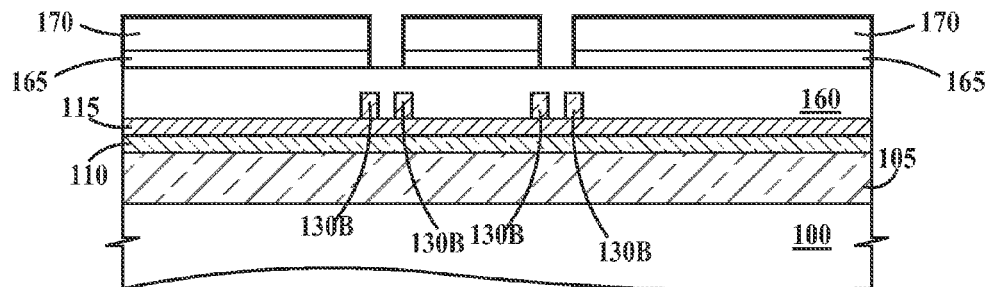

FIG. 10A is a top view, FIG. 10B is a cross-section view through line 10B-10B of FIG. 10A and FIG. 10C is a cross-section view through line 10C-10C of FIG. 10A. In FIG. 10, an OPL layer 160 is formed on top sidewalls and top surfaces of sidewall spacers 130B and the top surface of second hardmask layer 115 between sidewall spacers 130B. An antireflective coating (ARC) 165 is formed on the top surface of OPL 160 and a third patterned photoresist layer 170 is formed on the top surface of ARC 165. Patterned photoresist layer 145 is used to connect features formed the loops of sidewall spacers 130A into strips. ARC 165 was patterned during development of the photoresist. In one example, ARC 165 is a SiARC. Openings 170A, 170B, 170C and 170D in patterned photoresist layer 170 have a width W5. W5 is selected be greater than the space between adjacent sidewall spacers 130B, but less than the space between adjacent sidewall spacers plus twice the width of the sidewall spacers.

Figure 11A:
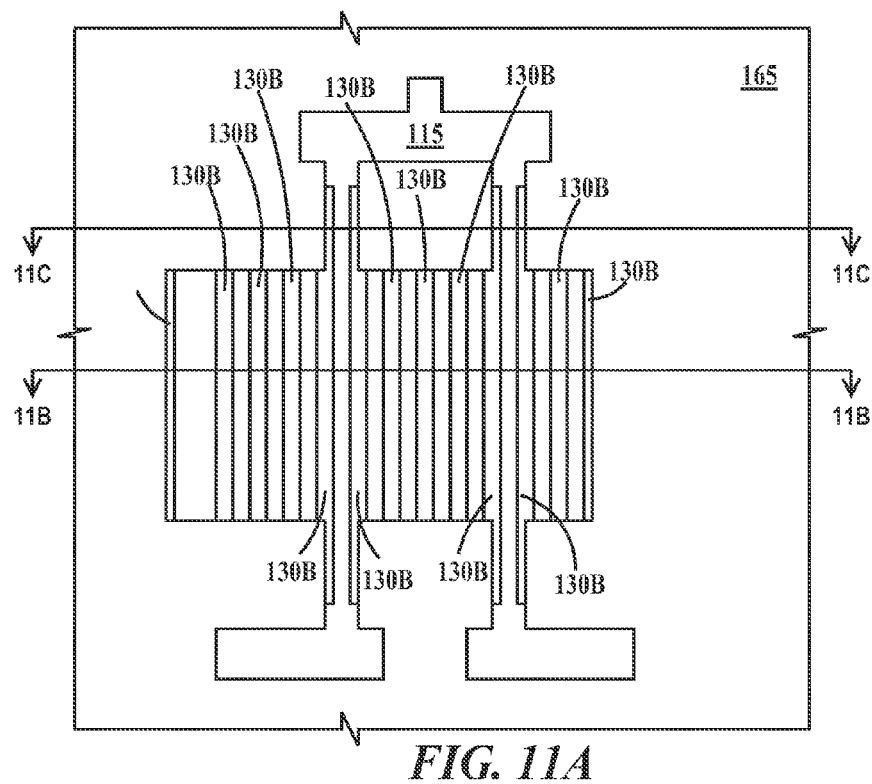
Figure 11B:
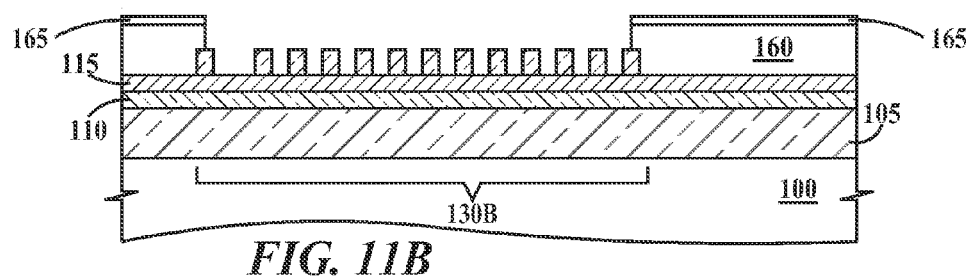
Figure 11C:
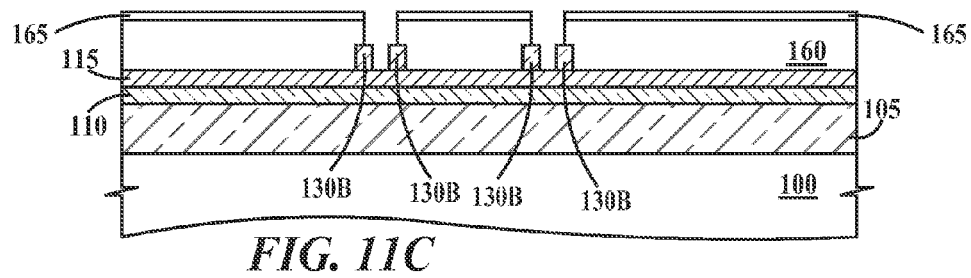

FIG. 11A is a top view, FIG. 11B is a cross-section view through line 11B-11B of FIG. 11A and FIG. 11C is a cross-section view through line 11C-11C of FIG. 11A. In FIGS. 11A, 11B and 11C, OPL 160 is removed where not protected by patterned photoresist layer 170 (see FIGS. 10B and 10C) to expose those portions of sidewall spacers 130B that were not under photoresist layer 170. Photoresist layer 170 is also removed during the OPL removal process to expose ARC 165. Since the pattern of patterned photoresist layer 170 has been transferred into OPL 160, OPL 160 is a pattern transfer layer as well as a planarization layer.

Figure 12A:
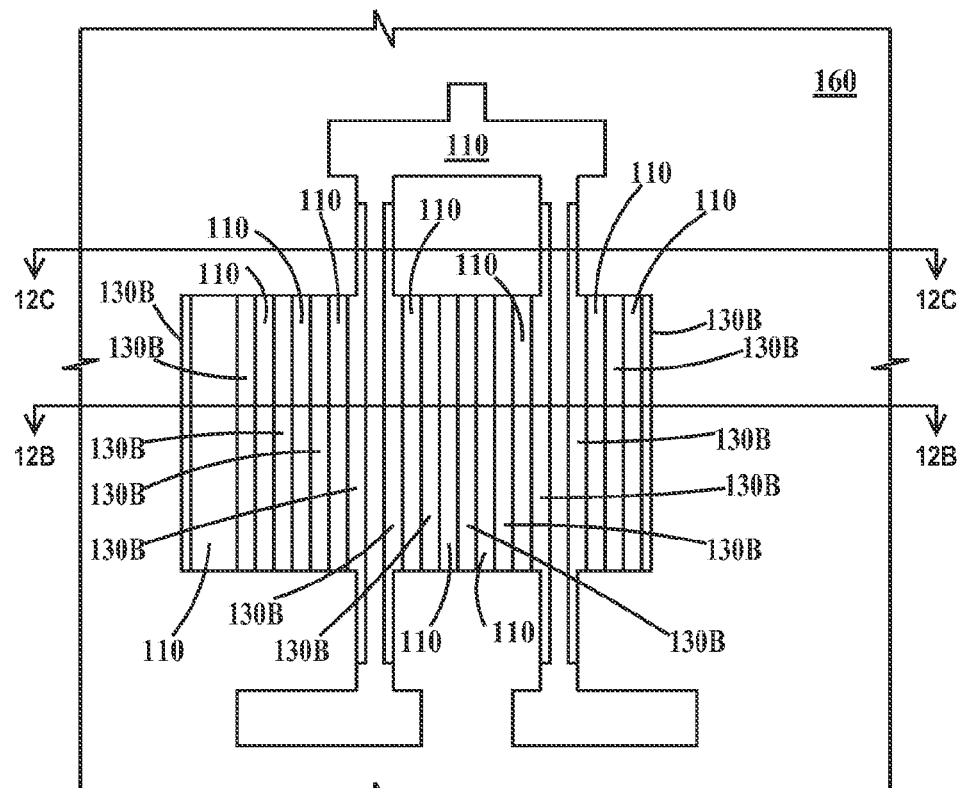
Figure 12B:
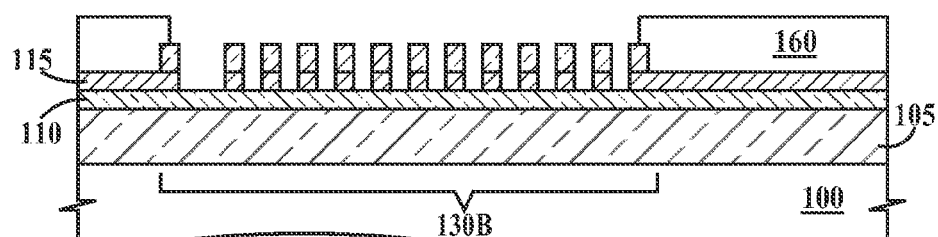
Figure 12C:
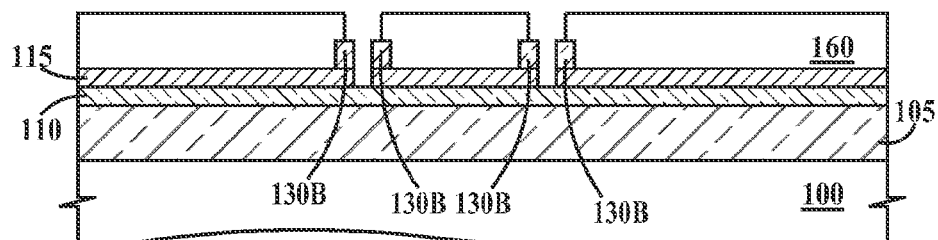

FIG. 12A is a top view, FIG. 12B is a cross-section view through line 12B-12B of FIG. 12A and FIG. 12C is a cross-section view through line 12C-12C of FIG. 12A. In FIGS. 12A, 12B and 12C, second hardmask layer 115 is removed (e.g., by RIE) where not protected by sidewall spacers 130B or by OPL 160. Any remaining ARC 165 (see FIGS. 11B and 11C) is also removed by the second hardmask etch process.

Figure 13A:
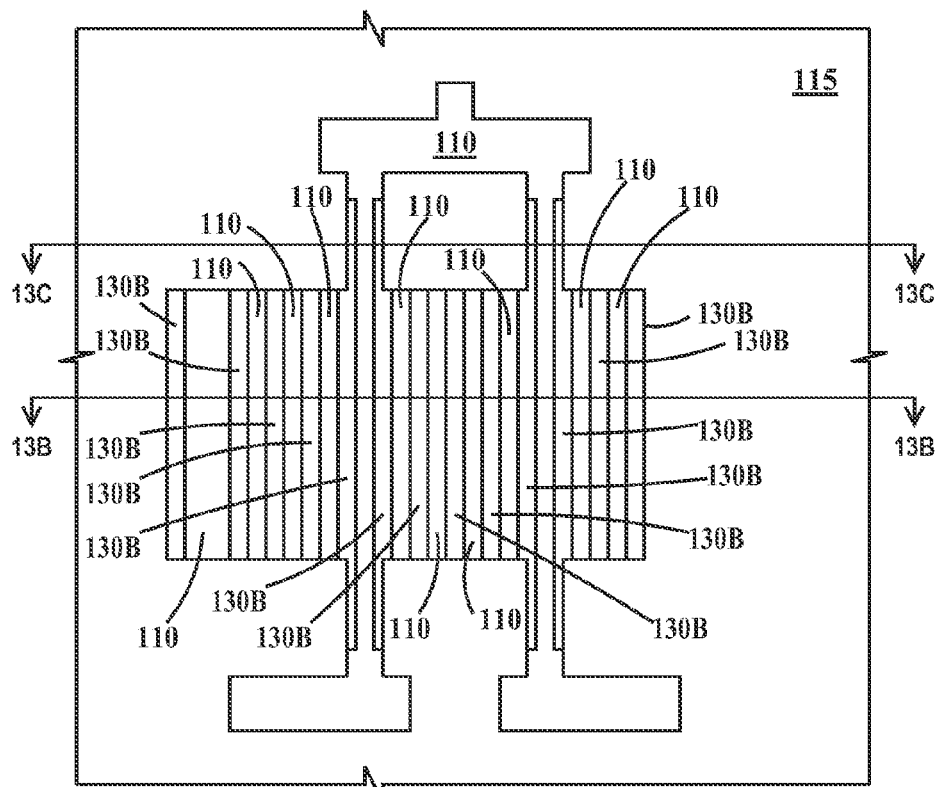
Figure 13B:
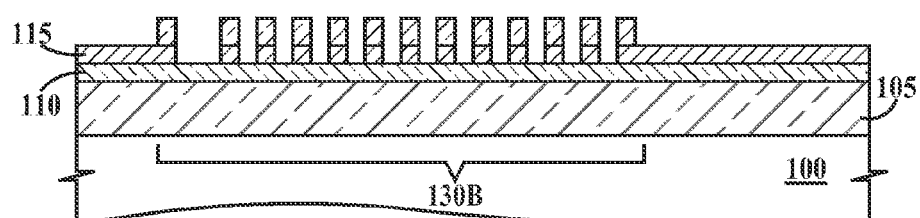
Figure 13C:
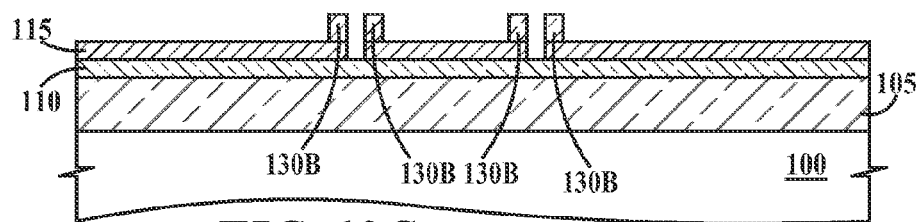

FIG. 13A is a top view, FIG. 13B is a cross-section view through line 13B-13B of FIG. 13A and FIG. 13C is a cross-section view through line 13C-13C of FIG. 13A. In FIGS. 13A, 13B and 13C, all remaining OPL 160 is removed (e.g., by RIE).

Figure 14A:
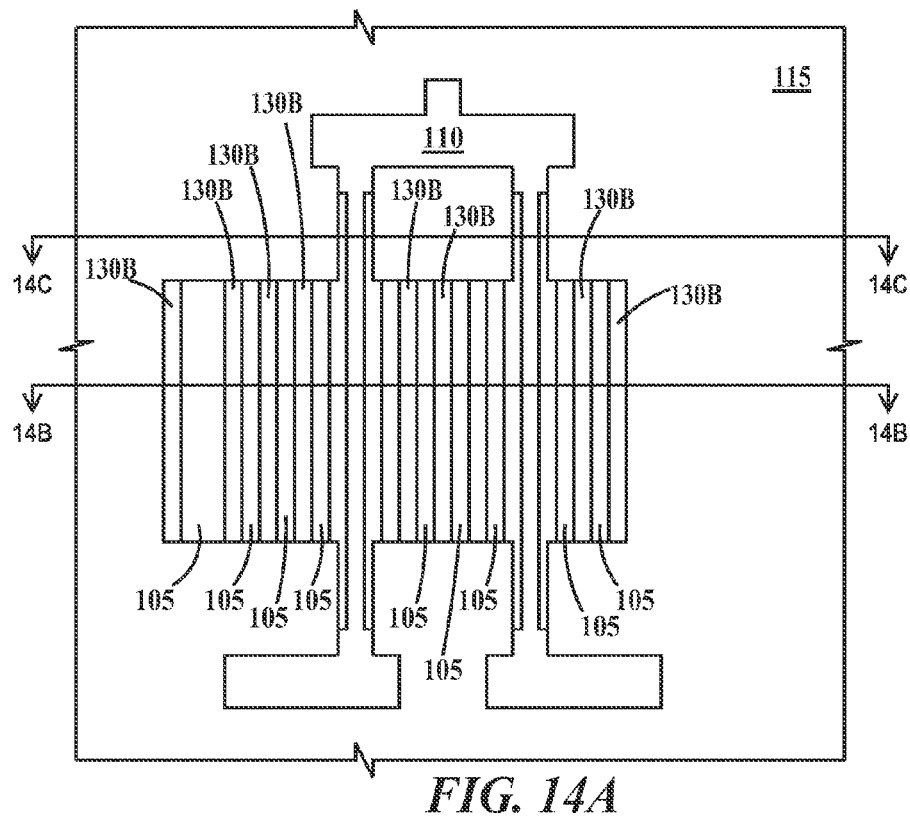
FIGS. 14 and 15 illustrate fabrication of damascene wires in a dielectric layer using the pattern of FIG. 13 according to embodiments of the present invention.
Figure 14B:
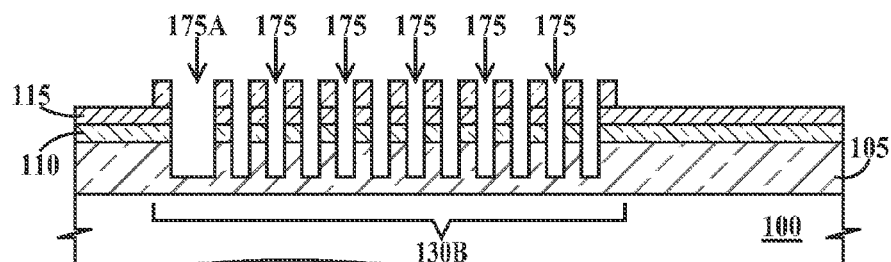
Figure 14C:
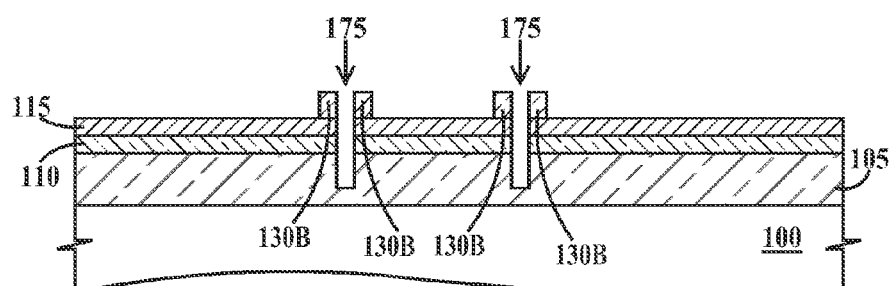
Figure 15A:
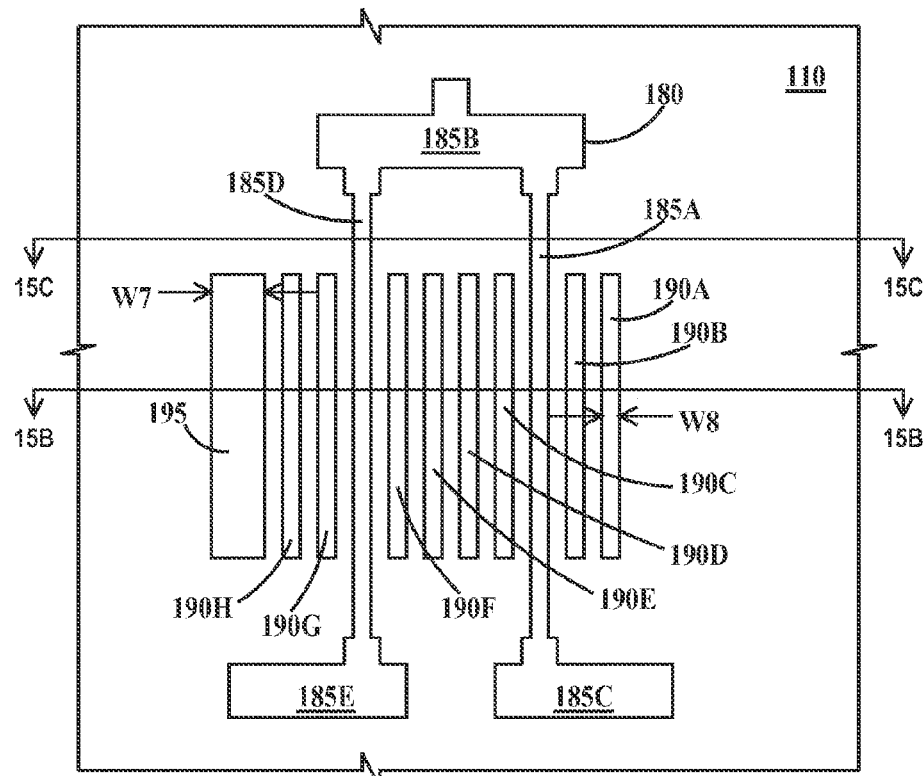
Figure 15B:
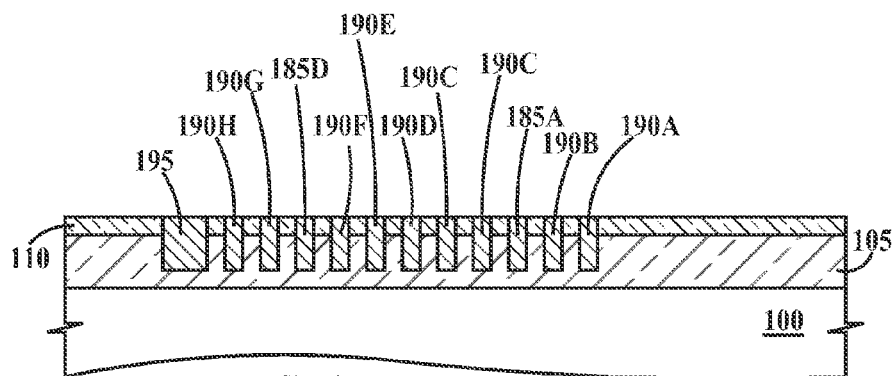
Figure 15C:
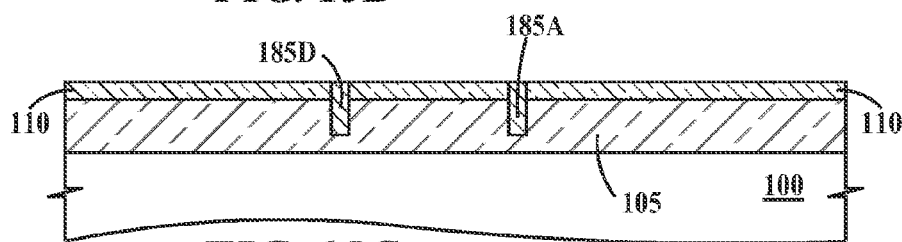

FIGS. 14 and 15 illustrate fabrication of damascene wires in a dielectric layer using the pattern of FIG. 13 according to embodiments of the present invention. FIG. 14A is a top view, FIG. 14B is a cross-section view through line 14B-14B of FIG. 14A and FIG. 14C is a cross-section view through line 14C-14C of FIG. 14A. In FIGS. 14A, 14B and 14C, trenches 175 are etched completely through first hardmask layer 110 and into dielectric layer 105, where the first hardmask layer is not protected by sidewall spacers 130B or second hardmask layer. FIG. 15A is a top view, FIG. 15B is a cross-section view through line 15B-15B of FIG. 15A and FIG. 15C is a cross-section view through line 15C-15C of FIG. 15A. In FIGS. 15A, 15B and 15C, trenches 175 of FIGS. 14B and 14C are filled with metal to form a wire 180, narrow wires 190A, 190B, 190C, 190D, 19E, 190F, 190G and 190H of width W8, and a wider wire 195 of width W7 with W7 greater than W8. In the example of FIGS. 14A, 14B and 14C, the trenches do not extend completely through dielectric layer 105 so wires 180,190A, 190B, 190C, 190D, 19E, 190F, 190G and 190H and 195 are dual damascene wires, with only the wire portion being illustrated. The step of forming the via portions of dual damascene wires is not illustrated. The openings for the vias would be formed before trenches 175 are formed or after trenches 175 are formed but before filling with metal. See discussion infra. If trenches 175 had extended through dielectric layer 175, then wires 180,190A, 190B, 190C, 190D, 19E, 190F, 190G and 190H and 19 would be single-damascene wires.

A damascene process is one in which wire trenches or via openings are formed in a dielectric layer, an electrical conductor of sufficient thickness to fill the trenches is deposited in the trenches and on a top surface of the dielectric. A chemical-mechanical-polish (CMP) process is performed to remove excess conductor and make the surface of the conductor co-planar with the surface of the dielectric layer to form damascene wires (or damascene vias). When only a trench and a wire (or only a via opening and a via) is formed the process is called single-damascene.

There are two processes for forming dual damascene wires. A via first dual-damascene process is one in which via openings are formed through the entire thickness of a dielectric layer followed by formation of trenches part of the way through the dielectric layer in any given cross-sectional view. A trench first dual-damascene process is one in which trenches are formed part way through the thickness of a dielectric layer followed by formation of vias inside the trenches the rest of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is deposited on a top surface of the dielectric and a CMP process is performed to make the surface of the conductor in the trench co-planar with the surface the dielectric layer to form dual-damascene wires and dual-damascene wires having integral dual-damascene vias.

Returning to FIGS. 15A, 15B and 15C, wire network 180 includes a first wire 185A, a second wire 185B, a third wire 185C, a fourth wire 185D and a fifth wire 185E. Opposite ends of wire 185A are connected to wires 185B and 185C. Opposite ends of wire 185D are connected to wires 185B and 185E. The shapes of wires 180,190A, 190B, 190C, 190D, 19E, 190F, 190G and 190H and 195 were not defined by sidewall spacers. The shapes of wires 180,190A, 190B, 190C, 190D, 19E, 190F, 190G and 190H and 195 were defined by the first photomask. The shapes of wire 190A, wire 185A, wire 190D, wire 190F, wire 190G and wire 195 were defined by mandrels. The shapes of wire 190B, 190C, 190E, wire 185D and wire 190H were defined by the space between sidewall spacers before the mandrels were removed. The shapes of wires 185B, 185E and 185E were defined by third patterned photoresist layer 170 of FIG. 10A. The shape of the dielectric between wires was defined by sidewall spacers after trimming. The shapes of the dielectric between wires are SIT shapes, the wires are not SIT shapes.

Note, that wires defined by mandrels and wires defined by the space between sidewall spacers before mandrel removal alternate. While the number of wires between wires 185A and 185D is an even number, with wire 185A defined by a mandrel and wire 185D defined by the space between spacers before mandrel removal, the method can produce a odd number of wires between the connected wire portions, with the connected wires both being defined by a mandrel or both being defined by the space between sidewall spacers before mandrel removal.

Figure 16:
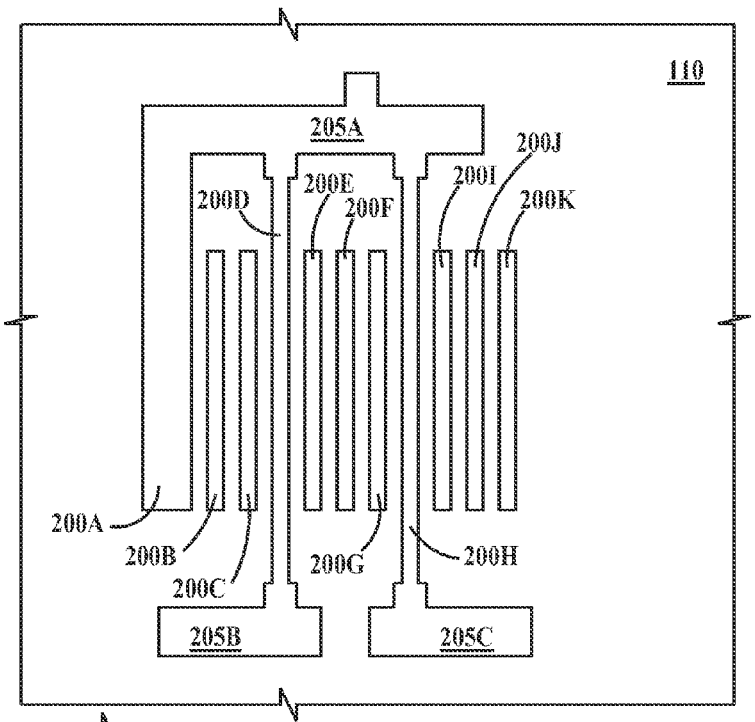
FIGS. 16 and 17 are top views of exemplary damascene wire structures that may be fabricated according to embodiments of the present invention.
Figure 17:
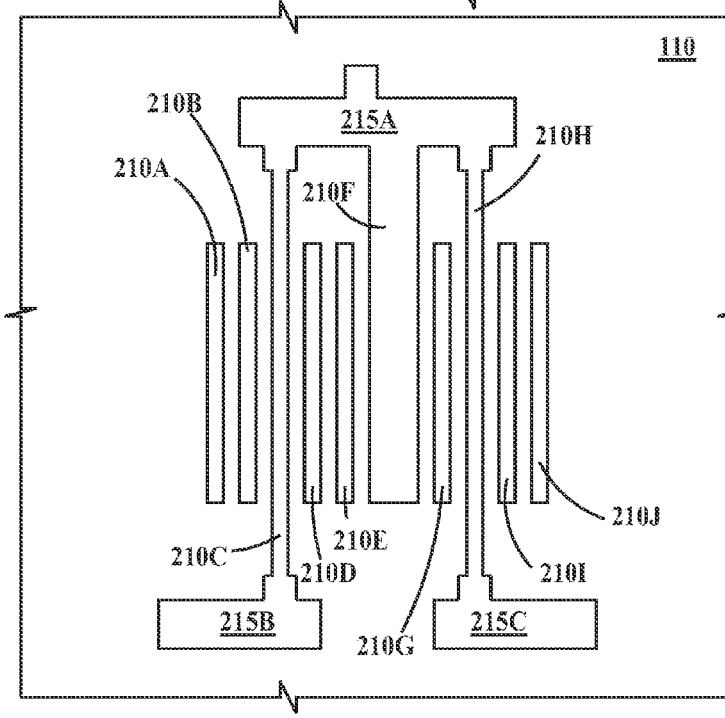

FIGS. 16 and 17 are top views of exemplary damascene wire structures that may be fabricated according to embodiments of the present invention. FIG. 16 includes wires 200A, 200B, 200C, 200D, 200E, 200F, 200G, 200H, 200I, 200J, 200K, 205A, 205B and 205C. Wire 205A connects narrow wires 200D and 200H with a wider wire 200A. There are two narrow wires (wires 200B and 200C) between wire 200A and 200D and three (an odd number) of narrow wires (wires 200E, 200F and 200G) between narrow wires 200D and 200H. FIG. 16 includes wires 210A, 210B, 210C, 210D, 210E, 210F, 210G, 210H, 2101, 210J, 210K, 215A, 215B and 215C. In FIG. 17, wire 215A connects wire 210C (a narrow wire), wire 210F (a wide wire) and wire 210H (a narrow wire). Wires 210D, 210E and 210G (narrow wires) and wire 210F (a wide wire) are between wires 210C and 210H. (narrow wires).

Thus, the embodiments of the present invention provide a method of fabricating damascene wiring levels wherein wires formed by SIT process and wires formed by non-SIT processes on the same level can be interconnected on that same level. However, the method is not limited to forming damascene wires but may be used to fabricate other structures of integrated circuits.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
using a first photomask, defining a set of mandrels on a hardmask layer on a substrate;
forming sidewall spacers on sidewalls of said mandrels, said sidewall spacers spaced apart;
removing said set of mandrels;
using a second photomask, removing regions of said sidewall spacers forming trimmed sidewall spacers and defining a pattern of first features;
forming a pattern transfer layer on said trimmed sidewall spacers and said hardmask layer not covered by said trimmed sidewall spacers;
using a third photomask, defining a pattern of second features in said transfer layer, at least one of said second features abutting at least one feature of said pattern of first features; and
simultaneously transferring said pattern of first features and said pattern of second features into said hardmask layer thereby forming a patterned hardmask layer.

2. The method of claim 1, wherein said pattern of first features comprises alternating first and second spaces between said trimmed sidewall spacers, said first spaces being spaces between said trimmed sidewall spacers before said removing said set of mandrels and said second spaces being spaces between said trimmed sidewall spacers formed by said removing said set of mandrels.

3. The method of claim 1, wherein the width of the spaces between said sidewall spacers before said removing said set of mandrels are about equal to the width of mandrels of set of said mandrels.

4. The method of claim 1, wherein a first subset of said set of mandrels has a first width and widths of a second subset of said set of mandrels have a second width and widths of the of spaces between said sidewall spaces before said removing said set of mandrels are about equal to said first width, said second width being greater than said first width.

5. The method of claim 1, wherein a width of one feature of said at least one of said pattern of second features is greater than a width of one feature said at least one feature of said pattern of first features.

6. The method of claim 1, wherein said at least one feature of said pattern of second features abuts and connects at least two features of said pattern of first set features.

7. The method of claim 6, wherein said at least one feature of said pattern of second features is wider than at least one feature of said at least two features of said pattern of first of features.

8. The method of claim 1, wherein a first feature of said pattern of second features abuts a first end of a feature of said first set of features and a second feature of said pattern of second features abuts a second end of said feature of said first set of features.

9. The method of claim 1, wherein at least one feature of said first set of features has a width greater than a width of at least one other feature of said first set of features.

10. The method of claim 1, further including:
using said patterned hardmask layer, etching trenches into a dielectric layer of said substrate directly under said hardmask layer; and
filling said trenches with an electrical conductor to form damascene wires in said dielectric layer.

11. A method comprising:
using a first photomask, defining a set of mandrels on a hardmask layer on a substrate;
forming sidewall spacer loops on sidewalls of said mandrels;
removing said set of mandrels;
using a second photomask, trimming said sidewall spacer loops to form trimmed sidewall spacers;
forming a pattern transfer layer on said trimmed sidewall spacers and said hardmask layer not covered by said trimmed sidewall spacers;
using a third photomask, defining a pattern of second features in said transfer layer, at least one of said second features abutting at least one feature of said pattern of first features; and
simultaneously transferring said pattern of first features and said pattern of second features into said hardmask layer thereby forming a patterned hardmask layer.

12. The method of claim 11, wherein said trimming said sidewall spacer loops includes:
forming an organic planarization layer on said sidewall spacer loops and hardmask layer not covered by said sidewall spacer loops;
forming a patterned photoresist layer on said organic planarization layer using said second photomask;
thinning said organic planarization layer where said organic planarization layer is not protected by said patterned photoresist layer, to expose regions of said looped sidewall spacers not under said patterned photoresist layer;
removing said patterned photoresist layer;
removing said exposed regions of said looped sidewall spacers; and
removing any remaining organic planarization layer.

13. The method of claim 11, wherein trimming said sidewall spacer loops includes:
removing the ends of said sidewall spacer loops to form a pair of trimmed sidewall spacers from each sidewall spacer loop.

14. The method of claim 11, wherein said pattern transfer layer is an organic planarization layer.

15. The method of claim 11, wherein said defining a pattern of second features in said transfer layer includes:
forming a patterned photoresist layer on said pattern transfer layer using said third photomask;
removing said pattern transfer layer where said pattern transfer layer is not protected by said patterned photoresist layer, forming a patterned transfer layer and exposing regions of said trimmed sidewall spacers not under said patterned photoresist layer; and
removing said patterned photoresist layer, said patterned transfer layer remaining.

16. The method of claim 15, further including:
after said simultaneously transferring said pattern of first features and said pattern of second features into said hardmask layer, removing said patterned transfer layer.

17. The method of claim 11, further including:
using said patterned hardmask layer, etching trenches into a dielectric layer of said substrate directly under said hardmask layer; and filling said trenches with an electrical conductor to form damascene wires in said dielectric layer.

18. The method of claim 11, wherein said hardmask layer comprises a lower layer on said substrate and an upper layer on said lower layer and said simultaneously transferring said pattern of first features and said pattern of second features into said hardmask layer includes:

etching said pattern of first features and said pattern of second features only into and through said upper layer.

19. The method of claim 11, wherein said hardmask layer comprises a lower layer on said substrate and an upper layer on said lower layer and said simultaneously transferring said pattern of first features and said pattern of second features into said hardmask layer includes etching said pattern of first features and said pattern of second features only into and through said upper layer to form a patterned upper layer and further including:

using said patterned upper layer, etching trenches through said lower layer and into a dielectric layer of said substrate directly under said lower layer; and filling said trenches with an electrical conductor;

performing a chemical-mechanical polish to remove said upper layer and to form damascene wires extending from a top surface of said lower layer and into said dielectric layer.

20. The method of claim 11, wherein said pattern of first features comprises alternating first and second spaces between said trimmed sidewall spacers, said first spaces being spaces between said trimmed sidewall spacers before said removing said set of mandrels and said second spaces being spaces between said trimmed sidewall spacers formed by said removing said set of mandrels.

* * * * *